(12) United States Patent
Weng

(10) Patent No.: US 7,989,937 B2
(45) Date of Patent: Aug. 2, 2011

(54) PACKAGE STRUCTURE AND MANUFACTURING METHOD THEREOF

(75) Inventor: Gwo-Liang Weng, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 505 days.

(21) Appl. No.: 11/647,299

(22) Filed: Dec. 29, 2006

(65) Prior Publication Data

US 2007/0222049 A1 Sep. 27, 2007

(30) Foreign Application Priority Data

Mar. 22, 2006 (TW) ............................... 95109936 A

(51) Int. Cl.
*H01L 23/02* (2006.01)

(52) U.S. Cl. ........ 257/680; 257/678; 257/730; 257/788; 257/E23.001

(58) Field of Classification Search .................. 257/680, 257/729, 678, 730, 788
See application file for complete search history.

(56) References Cited

U.S. PATENT DOCUMENTS 5,355,016 A * 10/1994 Swirbel et al. ................ 257/680
2005/0205980 A1* 9/2005 Manansala ..................... 257/680

FOREIGN PATENT DOCUMENTS

TW 451339 B 8/2001

OTHER PUBLICATIONS

Watlow Elelctric Manufacturing Company "Kapton Material", 2001.*

* cited by examiner

*Primary Examiner* — Marcos D. Pizarro
*Assistant Examiner* — Eva Yan Montalvo
(74) *Attorney, Agent, or Firm* — Rabin & Berdo, P.C.

(57) ABSTRACT

A package structure and a manufacturing method thereof are provided. The package structure includes a substrate, a chip and a packing material layer. The substrate has a top surface and a lateral surface. The top surface is connected with the lateral surface. The chip is disposed on the top surface. The packing material layer comprises a body portion and an extending portion. The body portion covers at least a part of the chip and the substrate. The extending portion is connected with the body portion and covers at least a part of the substrate. The extending portion is projected to the lateral surface and made from a transparent material.

15 Claims, 10 Drawing Sheets

300

PACKAGE STRUCTURE AND MANUFACTURING METHOD THEREOF

This application claims the benefit of Taiwan application Serial No. 095109936, filed Mar. 22, 2006, the subject matter of which is incorporated herein by reference.

BACKGROUND OF THE INVENTION

1. Field of the Invention

The invention relates in general to a package structure and a manufacturing method thereof, and more particularly to a package structure whose packing material layer is projected to a lateral surface and a manufacturing method thereof.

2. Description of the Related Art

The package structure prevents the semi-conductor chip from having short-circuits or other problems caused by moisture, collision or metallic particles. Various semi-conductor chips are developed and so are the packaging processes.

Referring to FIGS. 1A~1D, a conventional manufacturing process of package structure is shown. Firstly, as shown in FIG. 1A, a substrate 110 having a top surface 110a and a number of solder pads 110b is provided. The solder pads 110b are disposed on the top surface 110a. Next, as shown in FIG. 1B, a chip 120 having an active surface 120a and a number of connecting pads 120b is disposed on the substrate 110. The connecting pads 120b are disposed on the active surface 120a and correspond to the solder pads 110b. Then, as shown in FIG. 1C, a wiring bonding process is applied. The connecting pads 120b on the chip 120 and the solder pads 110b on the substrate 110 are wiring bonded by a number of bonding wires 130, such that the micro-electronic elements and the circuits thereof inside the chip 120 are electrically connected to the substrate 110 via the connecting pads 120b, the bonding wires 130 and the solder pads 110b. Next, as shown in FIG. 1D, a molding process is applied. A molding compound 140 is formed on the chip 120. The molding compound 140 prevents the connecting pads 120b, the bonding wires 130, and the solder pads 110b from being oxidized due to moisture and prevents the chip 120 from being damaged due to collision. Thus, a conventional package structure 100 is formed.

Referring to FIGS. 2A~2C, a molding process of FIG. 1D is shown. As shown in FIG. 2A, during the molding process, the substrate 110 and the chip 120 are retained by a top mold 151 and a bottom mold 152. As shown in FIG. 2B, the top mold 151 and the bottom mold 152 are coupled to form a receiving space 150a, wherein the chip 120 is positioned in the receiving space 150a. Next, the receiving space 150a is filled with the molding compound 140. The molding compound 140 is a fluid before having been solidified. Then, as shown in FIG. 2C, the molding compound 140 is thermo-set, and the top mold 151 and the bottom mold 152 are removed to form the package structure 100 of FIG. 1D. The fringe of filling the molding compound 140 is applied from the chip 120 to the edge of the substrate 110.

However, the shape of the molding compound 140 is subject to the shape of the top mold 151 and the shape of the bottom mold 152. Since the non-solidified molding compound 140 is a fluid, the receiving space 150a formed by the top mold 151 and the bottom mold 152 has to take the flow path of the molding compound 140 into consideration. Therefore, both the size and the shape of the molding compound 140 are subject to certain restrictions.

SUMMARY OF THE INVENTION

It is therefore an object of the invention to provide a package structure and a manufacturing method thereof. The package structure enables the packing material layer to be projected to the lateral surface to form a recess for receiving a filament or other elements. Therefore, the function of the package structure is more flexible.

The invention achieves the above-identified object by providing a package structure. The package structure includes a substrate, a chip and a packing material layer. The substrate has a top surface and a lateral surface. The top surface is connected with the lateral surface. The chip is disposed on the top surface. The packing material layer comprises a body portion and an extending portion. The body portion covers at least a part of the chip and the substrate. The extending portion is connected with the body portion and covers at least a part of the substrate. The extending portion is projected to the lateral surface and made from a transparent material.

The invention further achieves the above-identified object by providing a manufacturing method of package structure. The manufacturing method of package structure includes the following steps. Firstly, a substrate having a top surface and a lateral surface is provided. Next, a chip is disposed on the top surface. Then, at least a part of the chip is covered by a packing material layer projected to the lateral surface.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1A:
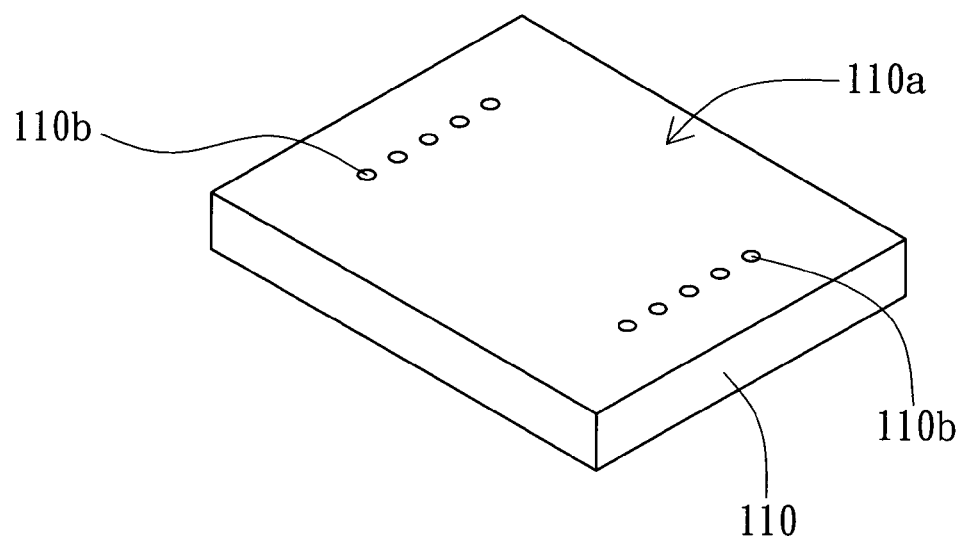
FIGS. 1A~1D illustrate a conventional manufacturing process of package structure.
Figure 1B:
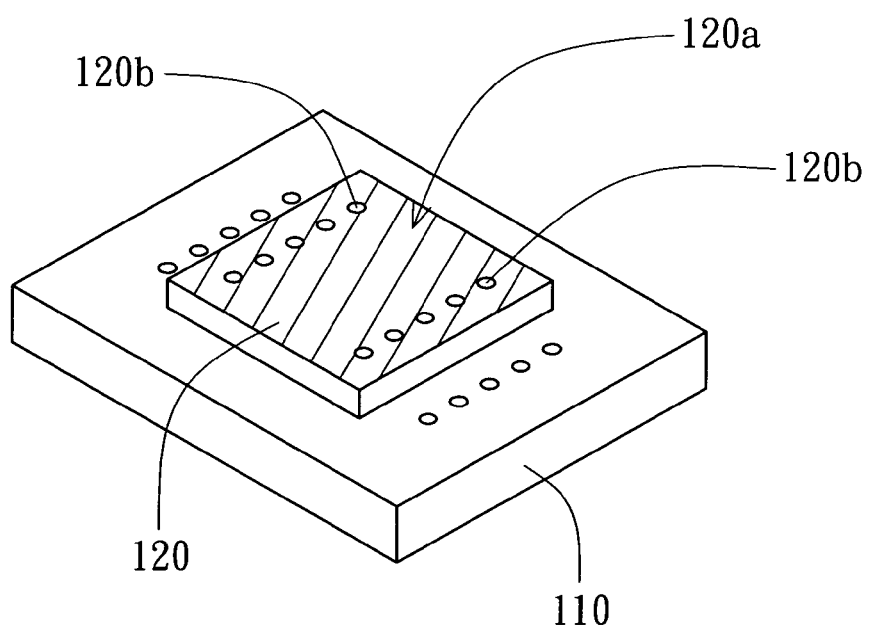
Figure 1C:
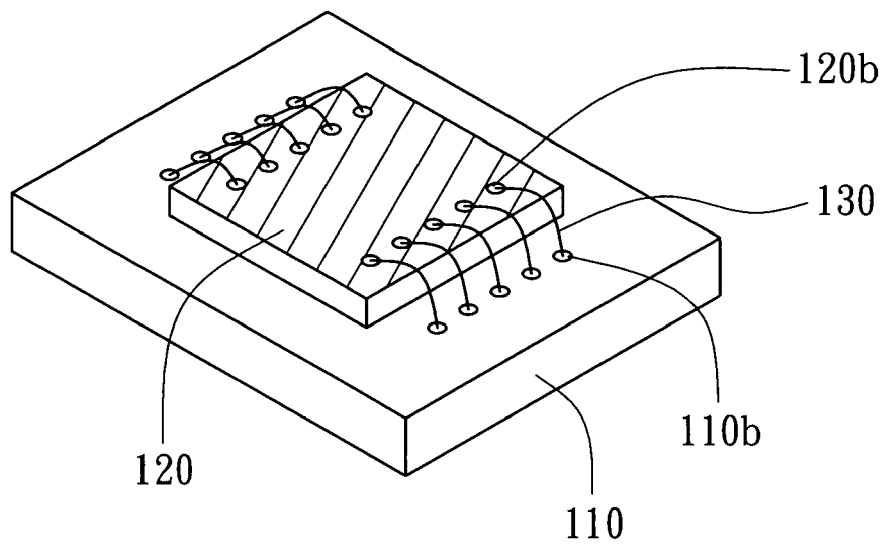
Figure 1D:
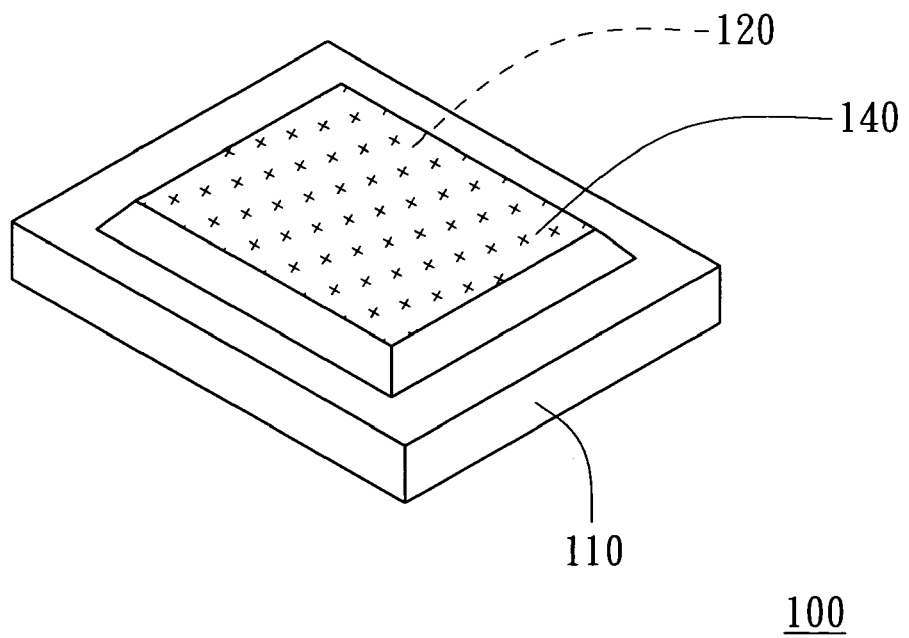
Figure 2A:
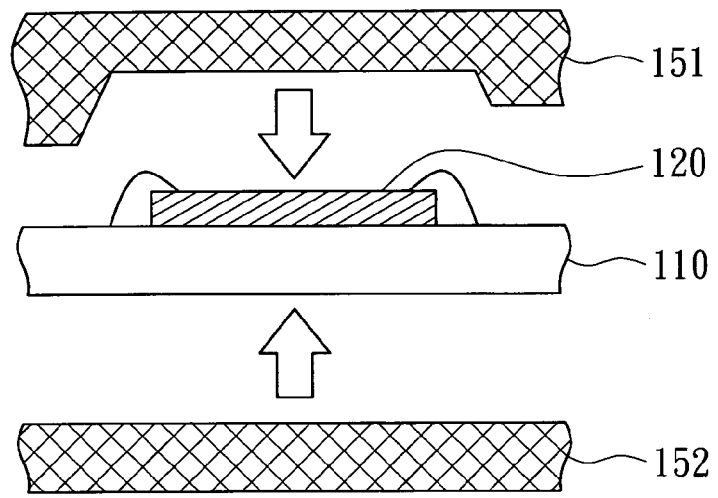
FIGS. 2A~2C illustrate a transfer molding process of FIG. 1D.
Figure 2B:
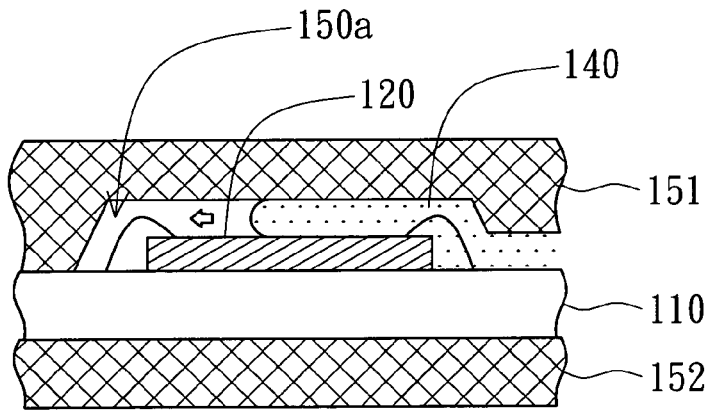
Figure 2C:
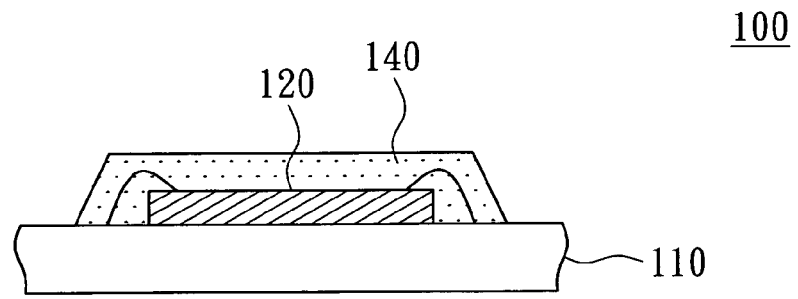
Figure 3:
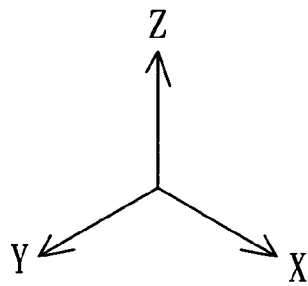
FIG. 3 illustrates a manufacturing process of the package structure according to a preferred embodiment of the invention.
Figure 3:
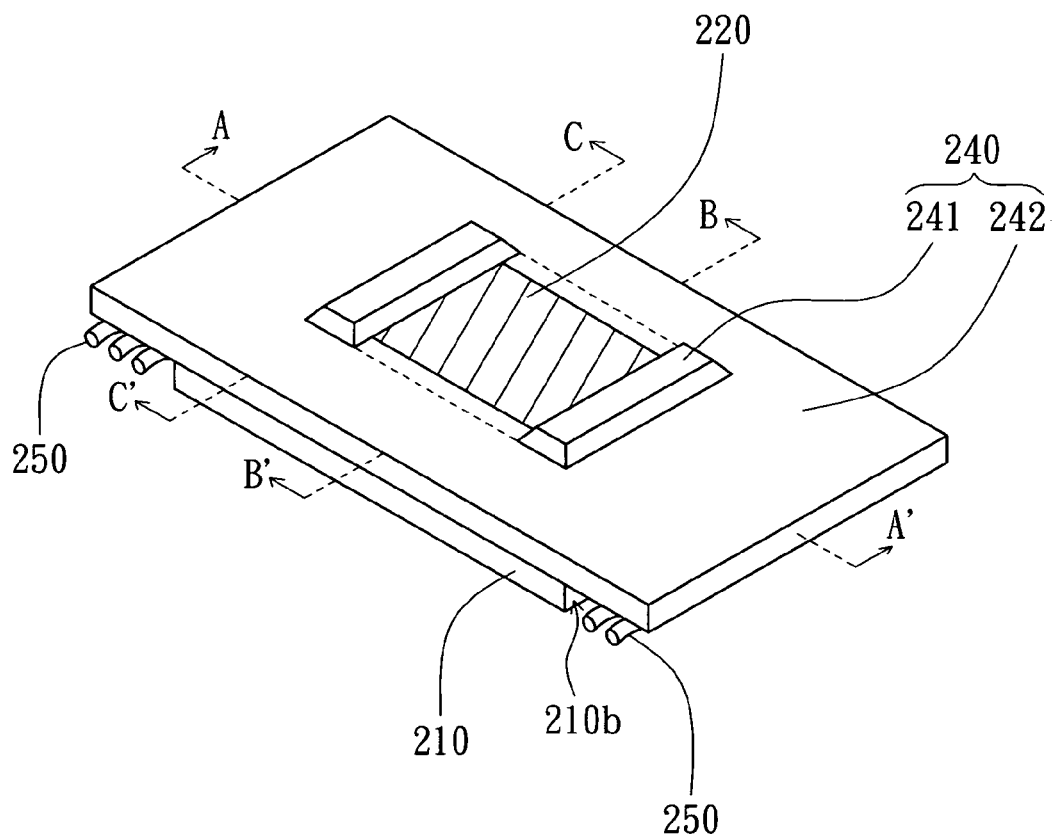
Figure 4A:
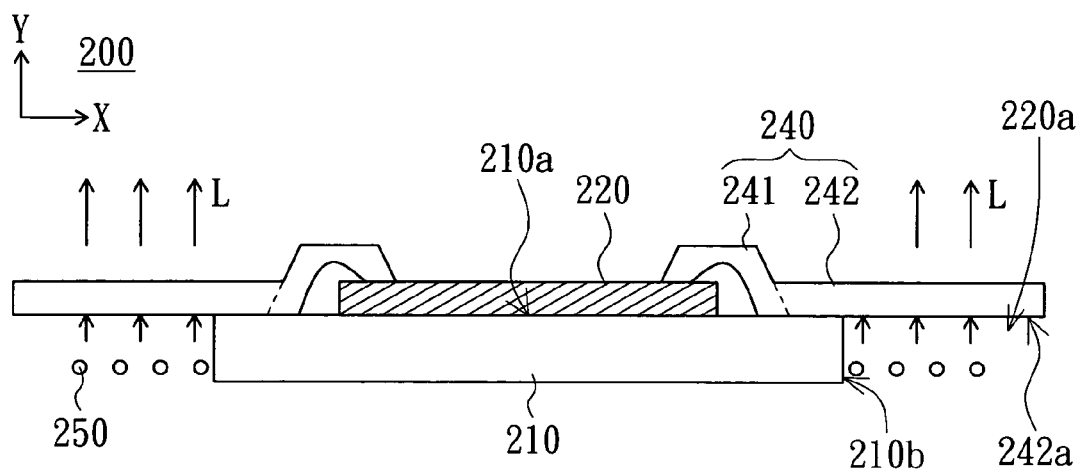
FIG. 4A illustrates a cross-sectional view of the package structure of FIG. 3 along a cross-sectional line A-A'.
Figure 4B:
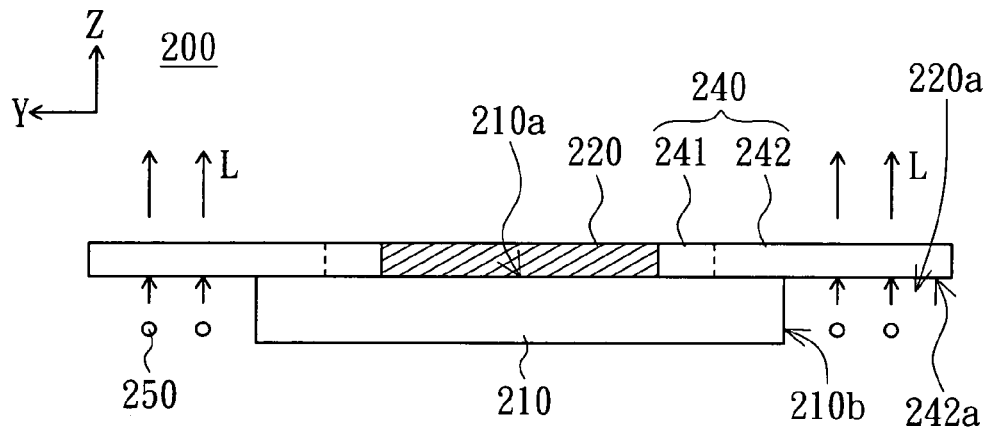
FIG. 4B illustrates a cross-sectional view of the package structure of FIG. 3 along a cross-sectional line B-B'.
Figure 4C:
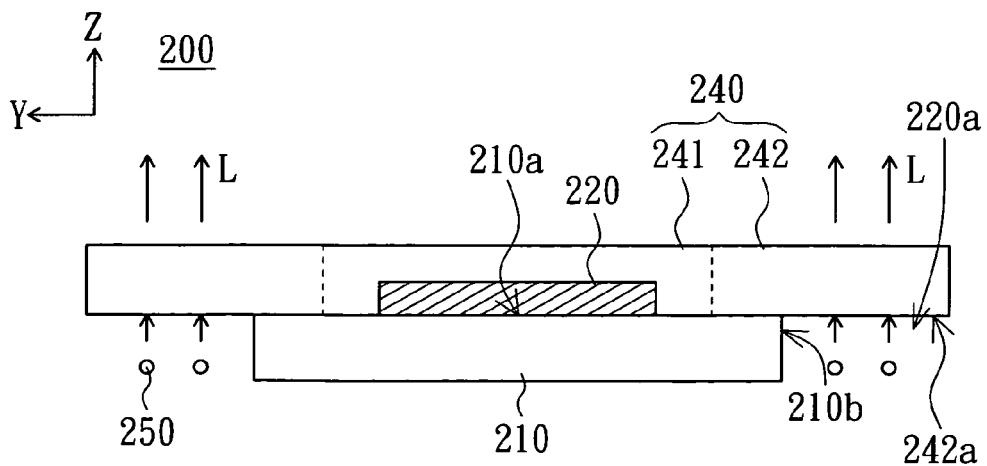
FIG. 4C illustrates a cross-sectional view of the package structure of FIG. 3 along a cross-sectional line C-C'.

Referring to both FIG. 3 and FIG. 4A~4C. FIG. 3 illustrates a manufacturing process of the package structure according to a preferred embodiment of the invention. FIG. 4A illustrates a cross-sectional view of the package structure of FIG. 3 along a cross-sectional line A-A'. FIG. 4B illustrates a cross-sectional view of the package structure of FIG. 3 along a cross-sectional line B-B'. FIG. 4C illustrates a cross-sectional view of the package structure of FIG. 3 along a cross-sectional line C-C'. The package structure 200 includes a substrate 210, a chip 220 and a packing material layer 240. The substrate 210 has a top surface 210a and a lateral surface 210b. The top surface 210a is connected with the lateral surface 210b. The chip 220 is disposed on the top surface 210a. The packing material layer 240 is disposed on the substrate 210 and covers at least a part of the chip 220. The packing material layer 240 is projected to the lateral surface 210b from the chip 220. In the present embodiment of the invention, the package structure 200 is exemplified by a fingerprint recognizer, while the chip 220 is exemplified by a fingerprint recognition chip.

Figure 5:
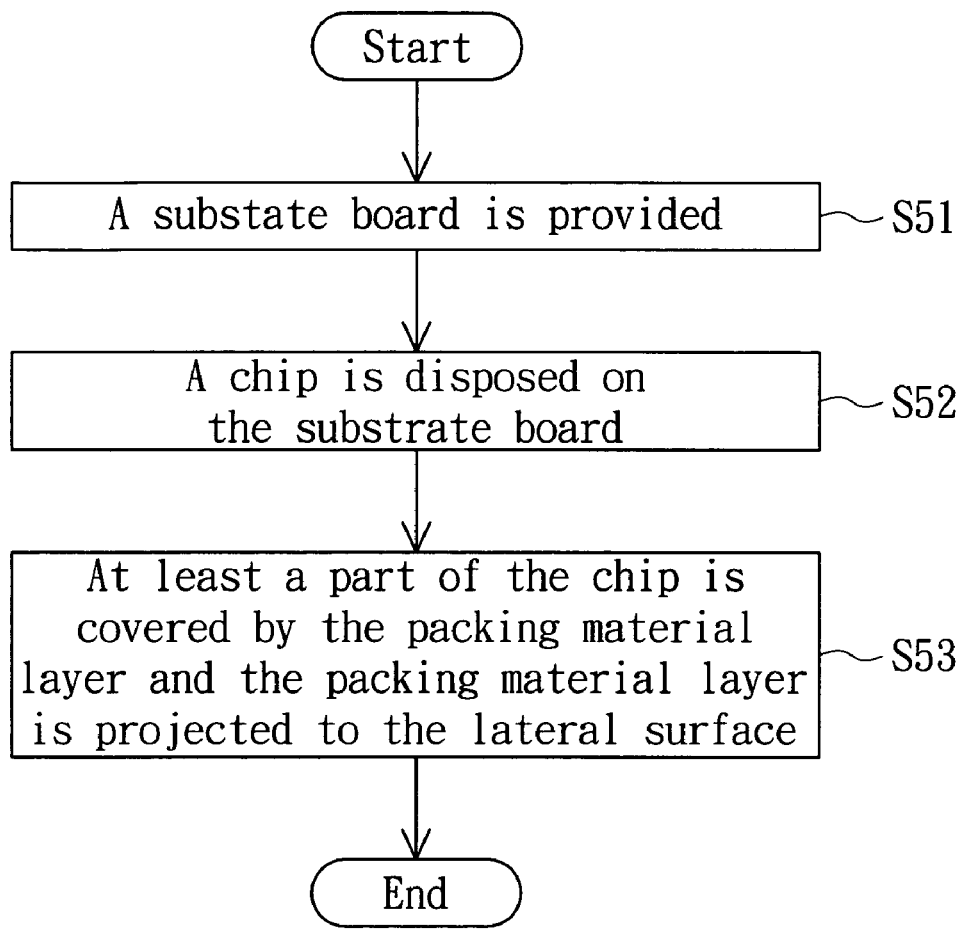
FIG. 5 illustrates a flowchart of a manufacturing method of the package structure according to the invention.
Figure 6A:
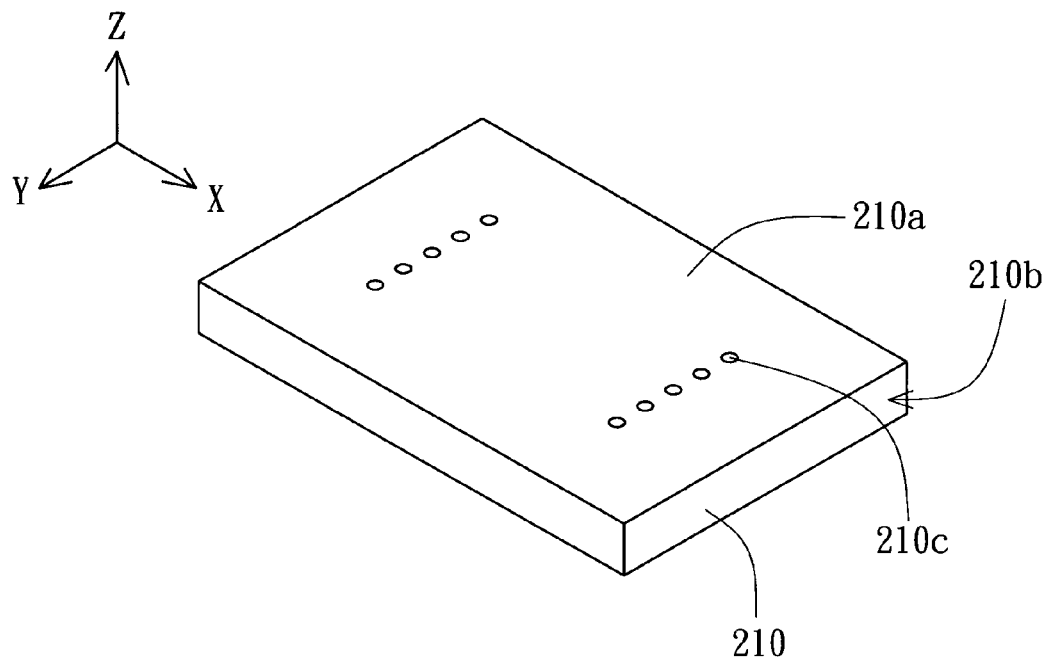
FIGS. 6A~6E illustrate a manufacturing process of the package structure of FIG. 3.

Referring to both FIG. 5 and FIG. 6A~6E. FIG. 5 illustrates a flowchart of a manufacturing method of the package structure according to the invention. FIG. 6A~6E illustrate a manufacturing process of the package structure of FIG. 3. The manufacturing method of package structure of the invention at least includes the following steps. Firstly, proceed to the step S51 of FIG. 5 as shown in FIG. 6A, a substrate 210 having a top surface 210a and a lateral surface 210b is provided. A number of solder pads 210c are disposed on the top surface 210a.

Figure 6B:
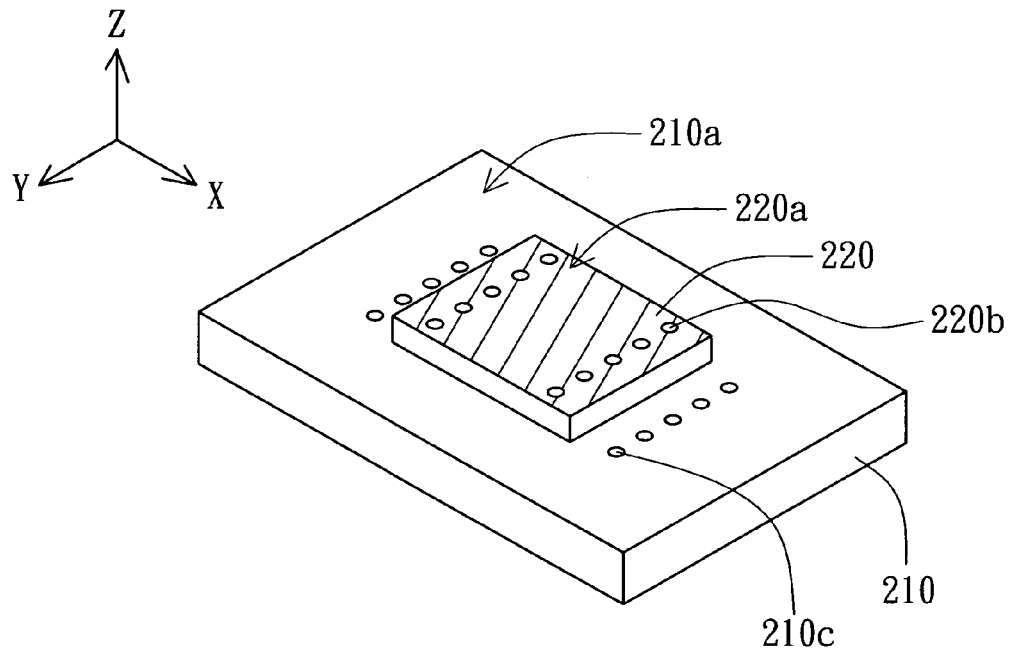
Figure 6C:
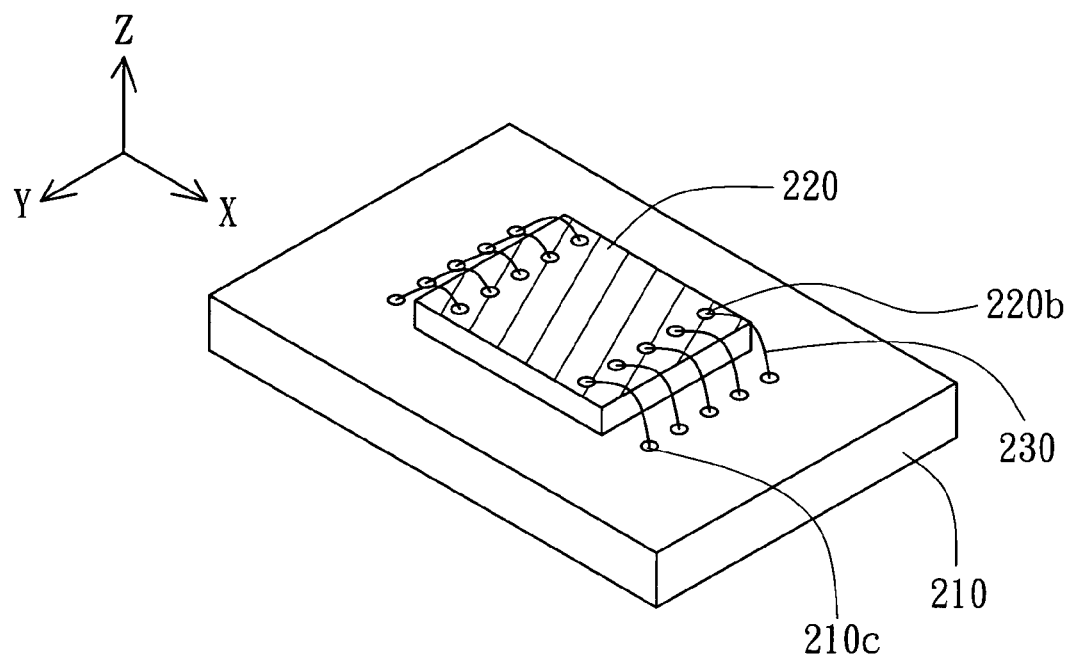

Next, proceed to the step S52 of FIG. 5 as shown in FIGS. 6B~6C, the chip 220 is disposed on the top surface 210a. In the present embodiment of the invention, the chip 220 is a fingerprint recognition chip with an active surface 220a. The user may touch the active surface 220a by a finger for recognizing the fingerprint. A number of connecting pads 220b corresponding to the solder pads 210c are disposed on the active surface 220a. In FIG. 6C, the connecting pads 220b and the solder pads 210c are wiring bonded by a number of bonding wires 230, such that the chip 220 and the substrate 210 are electrically connected.

Figure 6D:
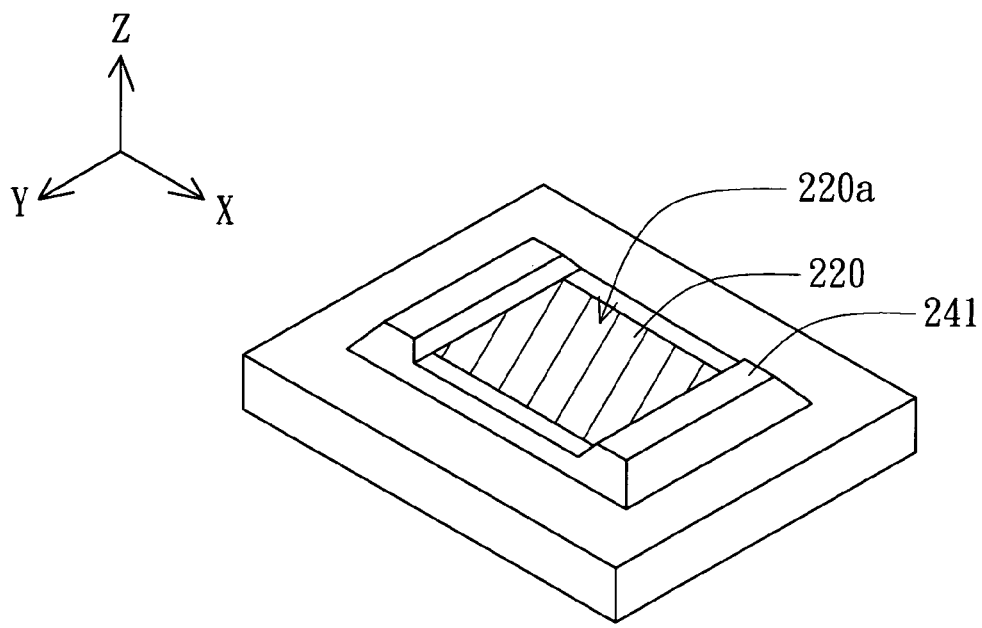
Figure 6E:
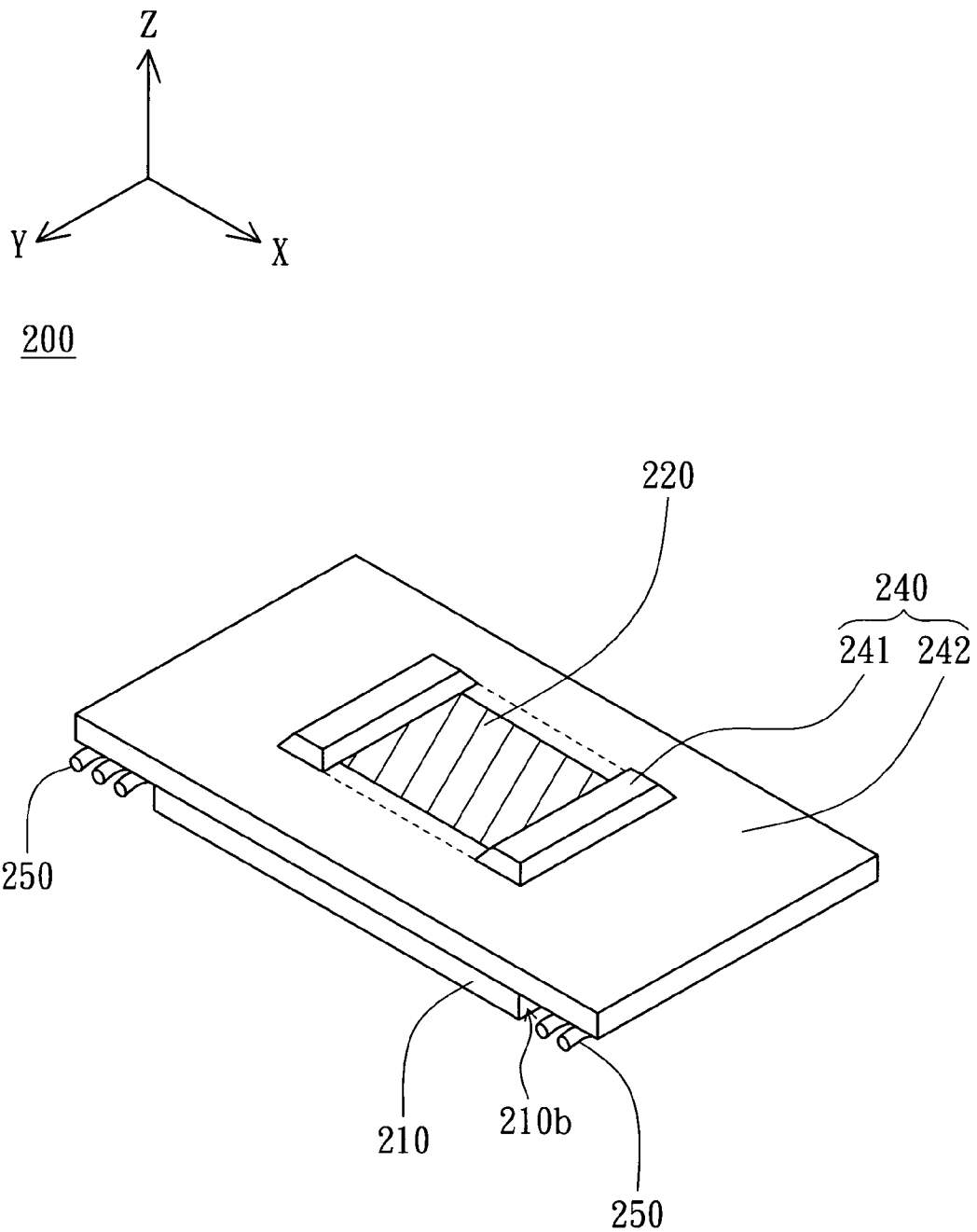

Then, proceed to the step S53 of FIG. 5 as shown in FIGS. 6D~6E. At least a part of the chip 220 is covered by the packing material layer 240. As shown in FIG. 6E, the packing material layer 240 is projected to the lateral surface 210b.

The step S53 of FIG. 5 further includes several sub-steps. Referring to both FIG. 6D and FIG. 6E. The packing material layer 240 includes a body portion 241 and an extending portion 242. As shown in FIG. 6D, at least a part of the chip 220 is covered by the body portion 241 for preventing the connecting pads 220b, the bonding wires 230 and the solder pads 210c from being damaged due to moisture or collision. In the present embodiment of the invention, the body portion 241 exposes a part of the active surface 220a such that the active surface 220a may contact with the finger for recognizing the fingerprint. Preferably, only a part of the top surface 210a is covered by the body portion 241 such that the surrounding area of the top surface 210a is exposed for carrying the extending portion 242.

Then, as shown in FIG. 6E, the extending portion 242 is coupled with the body portion 241 and projected to the lateral surface 210b. In the present embodiment of the invention, the extending portion 242 is adhered onto the body portion 241 by an adhesive. Wherein the body portion 241 exposes the surrounding area of the top surface 210a such that the extending portion 242 is carried in the surrounding area of the top surface 210a and will not come off easily.

Moreover, in the present embodiment of the invention, the substrate 210 is a rectangular structure with four lateral surfaces 210b. The extending portion 242 is a circular structure projected to the surrounding lateral surfaces 210b.

Referring to both FIG. 3 and FIG. 4A~4C. In the present embodiment of the invention, the package structure 200 is a fingerprint recognizer, and the extending portion 242 is made from a transparent material. The extending portion 242 has a bottom surface 242a, which defines a recess 220a with the lateral surfaces 210b. The package structure 200 further includes a light source 250 disposed in the recess 220a. The light source 250 is a filament electrified to emit a light L. The light L emitted by the light source 250 passes through the extending portion 242 to be projected outside.

According to the above disclosure, when the fingerprint recognizer of the present embodiment of the invention is electrified, the filament emits the light L around the fingerprint recognizer such that the user can know the current operation of the fingerprint recognizer, hence giving the electronic product a feature of fashion.

Figure 7:
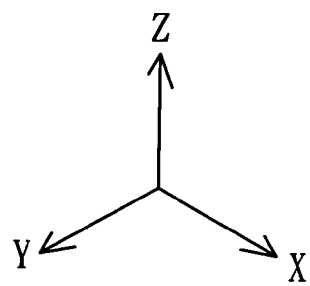
FIG. 7 illustrates an embodiment of the package structure wherein the packing material layer covers the entire chip.
Figure 7:
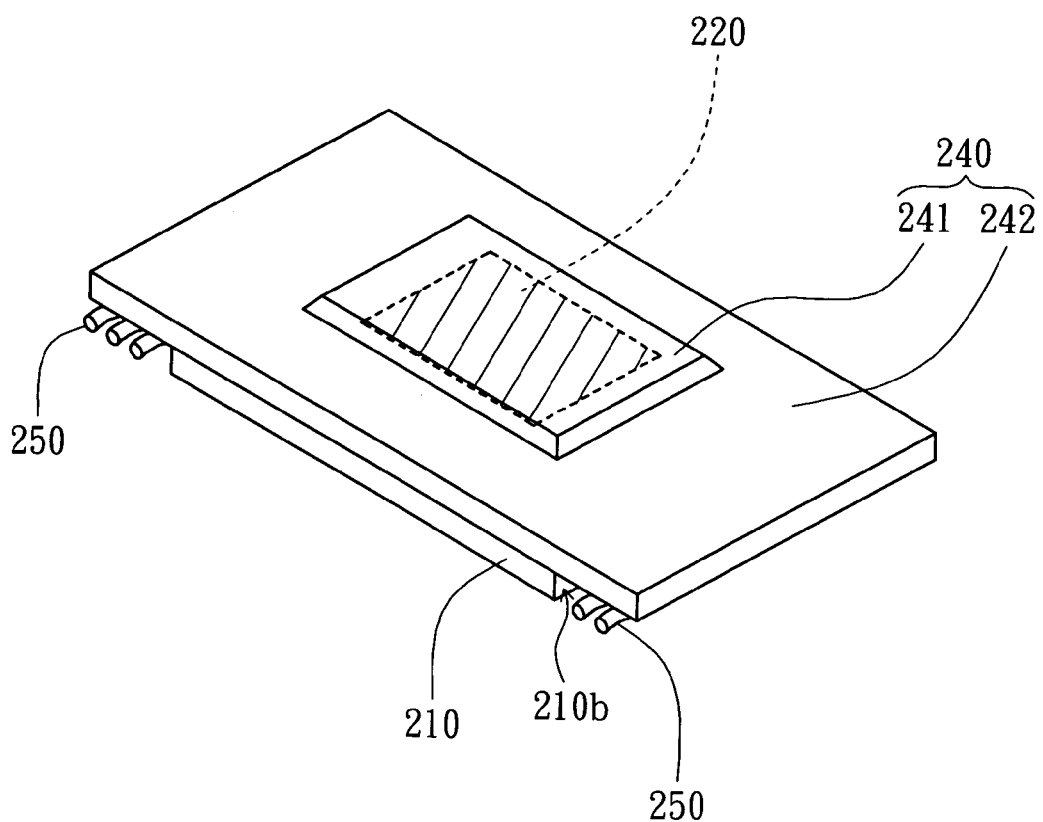

Despite the package structure disclosed in the above embodiment of the invention is exemplified by a fingerprint recognition chip, the structure of the invention is applicable to various packaged products. For example, referring to FIG. 7, the packing material layer 240 of the package structure 300 can cover the entire chip and is not limited to be made from a transparent material. Any structural design enables the packing material layer to be projected to the lateral surface is within the scope of the technology of the invention.

Despite the extending portion of the packing material layer disclosed in the above embodiment of the invention is exemplified by a circular structure projected to the lateral surfaces of the substrate, the packing material layer of the invention can be projected to only one or two lateral surfaces of the substrate. Any structural design enabling the packing material layer to be projected to one of the lateral surfaces is within the scope of the technology of the invention.

Despite the coupling between the body portion and the extending portion disclosed in the above embodiment of the invention is exemplified by adhesive coupling, any structural design enabling the packing material layer to be projected to the lateral surface after the body portion and the extending portion are engaged is within the scope of the technology of the invention.

According to the package structure and the manufacturing method thereof disclosed in the above embodiment of the invention, the chip is covered by the packing material layer projected to a lateral surface. Therefore the package structure and the manufacturing method thereof have the following advantages:

Firstly, the packing material layer of the package structure of the invention is projected to a lateral surface to form a recess capable of receiving a filament or other electronic elements, hence improving the functions of the package structure.

Secondly, the extending portion of the invention can be manufactured by simple molds, not only reducing the manufacturing cost of the package structure but also simplifying the manufacturing process.

Thirdly, the material and the shape of the extending portion of the invention can be adjusted to fit actual needs, largely increasing the flexibility and range in terms of the application of the package structure.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A package structure, comprising:
    a substrate having a top surface and a lateral surface, wherein the lateral surface is connected with and substantially perpendicular to the top surface;
    a chip disposed on the top surface; and
    a packing material layer, comprising:
        a body portion covering at least a part of the chip and the substrate; and an extending portion connected with the body portion and covering at least a part of the substrate, the extending portion projecting to said lateral surface, being made of a transparent material, and having a bottom surface that with the lateral surface defines a recess.

2. The package structure according to claim 1, wherein the packing material layer covers the entire chip.

3. The package structure according to claim 1, wherein the body portion exposes a part of the top surface for carrying the extending portion.

4. The package structure according to claim 1, wherein the extending portion is adhered onto the body portion.

5. The package structure according to claim 1, further comprising:
   a light source disposed inside the recess for emitting a light, the light passes through the extending portion to be projected outside.

6. The package structure according to claim 5, wherein the light source is a filament and is electrified to emit the light.

7. The package structure according to claim 6, wherein the package structure is a fingerprint recognizer and the chip is a fingerprint recognition chip.

8. The package structure according to claim 1, wherein the package structure is a wire bonding package structure.

9. The package structure according to claim 1, wherein the extending portion surrounds the body portion.

10. The package structure according to claim 1, wherein the substrate has a plurality of solder pads disposed on the top surface.

11. The package structure according to claim 10, wherein the chip has a plurality of connecting pads which are disposed on an active surface of the chip and corresponding the solder pads.

12. The package structure according to claim 1, wherein the side wall of the body portion is tilt to the lateral surface of the substrate.

13. The package structure according to claim 1, wherein the top of the body portion is higher than the top of the extending portion.

14. The package structure according to claim 1, wherein the extending portion is a flat board shaped structure.

15. The package structure according to claim 1, wherein the bottom surface of the extending portion and the top surface of the substrate are located at the same plane.

* * * * *